United States Patent
Okamura

(10) Patent No.: US 8,432,085 B2
(45) Date of Patent: Apr. 30, 2013

(54) MULTI-LAYER PIEZOELECTRIC ELEMENT HAVING LOW RIGIDITY METAL LAYERS, AND EJECTION APPARATUS AND FUEL EJECTION SYSTEM THAT EMPLOY THE SAME

(75) Inventor: Takeshi Okamura, Kirishima (JP)

(73) Assignee: Kyocera Corporation, Kyoto (JP)

( * ) Notice: Subject to any disclaimer, the term of this patent is extended or adjusted under 35 U.S.C. 154(b) by 480 days.

(21) Appl. No.: 12/671,061

(22) PCT Filed: Sep. 17, 2008

(86) PCT No.: PCT/JP2008/066752
§ 371 (c)(1),
(2), (4) Date: Jun. 14, 2010

(87) PCT Pub. No.: WO2009/038080
PCT Pub. Date: Mar. 26, 2009

(65) Prior Publication Data
US 2010/0288849 A1 Nov. 18, 2010

(30) Foreign Application Priority Data
Sep. 18, 2007 (JP) .................................. 2007-241260

(51) Int. Cl.
*H01L 41/083* (2006.01)
(52) U.S. Cl.
USPC .......................................... 310/328; 310/366
(58) Field of Classification Search .................. 310/328, 310/365–366
See application file for complete search history.

(56) References Cited

U.S. PATENT DOCUMENTS

| | | | |
|---|---|---|---|
| 7,358,655 B2 * | 4/2008 | Ragossnig et al. | 310/358 |
| 7,514,848 B2 | 4/2009 | Kobane et al. | 310/328 |
| 8,007,903 B2 * | 8/2011 | Okamura et al. | 428/316.6 |
| 8,049,397 B2 * | 11/2011 | Kato | 310/366 |
| 8,212,451 B2 * | 7/2012 | Inagaki et al. | 310/328 |
| 2005/0206274 A1 | 9/2005 | Kobane et al. | 310/328 |

(Continued)

FOREIGN PATENT DOCUMENTS

| | | |
|---|---|---|
| JP | 2003-318458 | 11/2003 |
| JP | 2005-129871 | 5/2005 |

(Continued)

OTHER PUBLICATIONS

Extended European search report dated Mar. 13, 2012 issued in corresponding European application 08832481.9.

*Primary Examiner* — Jaydi San Martin
(74) *Attorney, Agent, or Firm* — DLA Piper LLP (US)

(57) ABSTRACT

A multi-layer piezoelectric element having high durability of which amount of displacement is suppressed from varying even when operated continuously over a long period of time with a higher electric field under a high pressure is provided. The multi-layer piezoelectric element which has a multi-layer structure, the multi-layer structure comprising a plurality of piezoelectric material layers and a plurality of metal layers that are stacked alternately, wherein the piezoelectric material layer is constituted from a plurality of piezoelectric crystal grains, the plurality of metal layers comprise internal electrodes and low-rigidity metal layer that has rigidity lower than those of the internal electrodes and the piezoelectric material layer, and wherein the low-rigidity metal layer has a plurality of metal parts that are separated from each other, and an end of the metal part infiltrates between the piezoelectric crystal grains.

14 Claims, 7 Drawing Sheets

U.S. PATENT DOCUMENTS

| | | | |
|---|---|---|---|
| 2006/0238073 A1 | 10/2006 | Ragossnig et al. | 310/328 |
| 2007/0080612 A1 | 4/2007 | Terazono et al. | 310/366 |
| 2007/0278907 A1 | 12/2007 | Kondo et al. | 310/364 |
| 2009/0162706 A1* | 6/2009 | Okamura et al. | 429/12 |
| 2009/0220765 A1 | 9/2009 | Okamura et al. | |
| 2010/0032503 A1* | 2/2010 | Terazono et al. | 239/569 |
| 2010/0276511 A1* | 11/2010 | Okamura | 239/102.2 |
| 2010/0294853 A1* | 11/2010 | Okamura | 239/102.2 |
| 2010/0326405 A1* | 12/2010 | Nakamura | 123/498 |

FOREIGN PATENT DOCUMENTS

| | | |
|---|---|---|
| JP | 2005-235863 | 9/2005 |
| JP | 2006-013437 | 1/2006 |
| JP | 2006-518934 | 8/2006 |
| JP | 2007-027692 | 2/2007 |
| WO | 2007037377 A1 | 4/2007 |
| WO | 2007097460 A1 | 8/2007 |
| WO | 2007102369 A1 | 9/2007 |

* cited by examiner

US 8,432,085 B2

MULTI-LAYER PIEZOELECTRIC ELEMENT HAVING LOW RIGIDITY METAL LAYERS, AND EJECTION APPARATUS AND FUEL EJECTION SYSTEM THAT EMPLOY THE SAME

CROSS-REFERENCE TO THE RELATED APPLICATIONS

This application is a national stage of international application No. PCT/JP2008/066752, filed on Sep. 17, 2008, and claims the benefit of priority under 35 USC 119 to Japanese Patent Application No. 2007-241260, filed on Sep. 18, 2007, the entire contents of which are incorporated herein by reference.

TECHNICAL FIELD

The present invention relates to a multi-layer piezoelectric element, an ejection apparatus and a fuel ejection system, for example a multi-layer piezoelectric element used as the drive element (piezoelectric actuator) for fuel ejection apparatus of automobile engine, liquid ejection apparatus of ink jet printer or the like, precision positioning device or vibration preventing device for an optical apparatus, as a sensor element used in combustion pressure sensor, knocking sensor, acceleration sensor, load sensor, ultrasonic sensor, pressure sensor, yaw rate sensor or the like, or as a circuit component mounted in piezoelectric gyro, piezoelectric switch, piezoelectric transducer, piezoelectric breaker or the like, and an ejection apparatus and a fuel ejection system that employ the multi-layer piezoelectric element.

BACKGROUND

There have been demands for a greater amount of displacement as well as size reduction of the multi-layer piezoelectric element. As a result, the multi-layer piezoelectric element is required to be operable under harsher conditions, namely continuous operation over a long period of time with higher electric field.

Unlike other multi-layer electronic components such as capacitor, the multi-layer piezoelectric element itself undergoes continuous changes in dimension during operation. A large amount of displacement of the multi-layer piezoelectric element as a whole is achieved as all piezoelectric material layers act while maintaining firm contact with each other with internal electrodes interposed therebetween. As a result, the element is subject to intense stresses.

As a solution to the problem described above, such an element has been proposed as a porous layer is provided as a target fracture layer in the inside of the piezoelectric material layer (Patent Document 1). Patent Document 1 describes an attempt to relieve the stress generated in each of the piezoelectric material layers by causing the element to break in the target fracture layer.

Patent Document 1: National Publication of Translated Version (Kohyo) No. 2006-518934

DISCLOSURE OF THE INVENTION

Problems to be Solved by the Invention

The method disclosed in Patent Document 1 is capable of relieving the stress generated in the piezoelectric material layer to some extent. However, the multi-layer piezoelectric element is required to be operable under the condition of a higher voltage applied thereto. When the target fracture layer is used under such a harsh condition, cracks generated in the target fracture layer may grow in an unpredictable direction. This is because the internal electrode has a continuous plate structure larger than the crystal grains of the adjacent piezoelectric material layers.

In the element having such a structure as described above, the crystal grains that deform to expand and contract during the piezoelectric operation are restricted by the internal electrodes, and therefore it becomes difficult for the crystal grains to individually deform in accordance to the drive voltage. As a result, the crystal grains remain always under stress.

In case the target fracture layer is provided within the piezoelectric material layer of the multi-layer piezoelectric element, cracks may grow between the crustal grains, not just in the target fracture layer, when stress is generated. When the cracks grow, fracture may occur within and between the crystal grains, or the crack may reach the internal electrode, thus giving rise to the possibility of short-circuiting between internal electrodes of opposite polarities.

In case the piezoelectric element is operated with a high electric field under a high pressure, in particular, the piezoelectric element is subjected to instantaneous stress of high intensity and therefore it is difficult to stabilize the direction of crack. Also because there is a demand for piezoelectric element that is capable of continuous operation over a long period of time with a higher electric field under a high pressure, it is necessary to effectively decrease the stress generated in the element.

The present invention has been devised to solve the problems described above, and has an object of providing a multi-layer piezoelectric element having high durability of which amount of displacement is suppressed from varying even when operated continuously over a long period of time with a higher electric field under a high pressure, and an ejection apparatus and a fuel ejection system that employ the multi-layer piezoelectric element.

Means for Solving the Problems

The inventors of the present application found that stress generated in the multi-layer piezoelectric element can be effectively dispersed by providing a low-rigidity metal layer having a plurality of metal parts that are separated from each other. The low-rigidity metal layer comprising the metal parts has rigidity lower than those of the internal electrodes and the piezoelectric material layer.

A first multi-layer piezoelectric element of the present invention comprises a multi-layer structure in which a plurality of piezoelectric material layers and a plurality of metal layers are stacked alternately one on another, wherein the piezoelectric material layer comprises a plurality of piezoelectric crystal grains, the plurality of metal layers comprise internal electrodes and low-rigidity metal layer that has rigidity lower than those of the internal electrodes and the piezoelectric material layer, the low-rigidity metal layer comprises a plurality of metal parts that are separated from each other, and an end of the metal part infiltrates between the piezoelectric crystal grains.

A second multi-layer piezoelectric element of the present invention comprises a multi-layer structure in which a plurality of piezoelectric material layers and a plurality of metal layers that are stacked alternately one on another, wherein the piezoelectric material layer comprises a plurality of piezoelectric crystal grains and a bonding material that is disposed between the piezoelectric crystal grains and bonds the adjacent piezoelectric crystal grains together, the plurality of metal layers comprise internal electrode and low-rigidity metal layer that has rigidity lower than those of the internal electrode and the piezoelectric material layer, the low-rigidity metal layer comprises a plurality of metal parts that are separated from each other, and an end of the metal part is bonded with the piezoelectric crystal grains via the bonding material.

The ejection apparatus of the present invention comprises a container comprising an ejection hole, and the multi-layer piezoelectric element described above housed in the container, wherein the ejection apparatus configured to eject a liquid filled in the container through the ejection hole by an operation of the multi-layer piezoelectric element.

The fuel ejection system of the present invention comprises a common rail that stores a high-pressure fuel, an ejection apparatus that ejects the fuel stored in the common rail, a pressure pump that supplies the high-pressure fuel to the common rail and an ejection control unit that supplies a drive signal to the ejection apparatus.

Advantage

In the first multi-layer piezoelectric element of the present invention, the piezoelectric material layer comprises a plurality of piezoelectric crystal grains, while the plurality of metal layers comprise internal electrodes and the low-rigidity metal layer that has rigidity lower than those of the internal electrodes and the piezoelectric material layer, and the low-rigidity metal layer comprises a plurality of metal parts that are separated from each other.

In the first multi-layer piezoelectric element of the present invention comprising as described above, stress is absorbed by the low-rigidity metal layer when the multi-layer piezoelectric element is subjected to strong extraneous impact or stress during operation of the multi-layer piezoelectric element. Therefore the first multi-layer piezoelectric element of the present invention is capable of suppressing cracks from occurring in the internal electrodes and the piezoelectric material layer, thereby suppressing short-circuiting from occurring between the internal electrodes that adjoin each other in the stacking direction.

Moreover, in the first multi-layer piezoelectric element of the present invention, since the end of the metal part infiltrates between the piezoelectric crystal grains, durability of the piezoelectric material layer is improved. This is because the end of the metal part that infiltrates between the piezoelectric crystal grains increases the contact area between the metal part and the piezoelectric crystal grains.

The piezoelectric crystal grains generate heat while undergoing deformation under stress. In the first multi-layer piezoelectric element of the present invention, however, since the contact area between the metal part and the piezoelectric crystal grains is increased, heat dissipation from the piezoelectric crystal grains to the metal part is increased. Efficient dissipation of heat generated in the piezoelectric crystal grains mitigates the deterioration of durability. Thus durability of the piezoelectric material layer is improved.

In the second multi-layer piezoelectric element of the present invention, the piezoelectric material layer comprises a plurality of piezoelectric crystal grains and the bonding material disposed between the plurality of piezoelectric crystal grains and bonds the adjacent piezoelectric crystal grains together, while the plurality of metal layers comprise internal electrodes and the low-rigidity metal layer that has rigidity lower than those of the internal electrode and the piezoelectric material layer, and the low-rigidity metal layer comprises a plurality of metal parts that are separated from each other. The end of the metal part is bonded with the bonding material.

In the second multi-layer piezoelectric element of the present invention comprising as described above, stress is absorbed by the low-rigidity metal layer when the multi-layer piezoelectric element is subjected to strong extraneous impact or stress during operation of the multi-layer piezoelectric element. Therefore the first multi-layer piezoelectric element of the present invention is capable of suppressing cracks from occurring in the internal electrodes and in the piezoelectric material layer, thereby suppressing short-circuiting from occurring between the internal electrodes that adjoin each other in the stacking direction.

Also because the second multi-layer piezoelectric element of the present invention comprises the bonding material that bonds the adjacent piezoelectric crystal grains and the metal part, bonding between the piezoelectric crystal grains and the metal part is increased. As a result, position of the metal part can be stabilized and the multi-layer piezoelectric element having stable amount of displacement is obtained.

Figure 1:
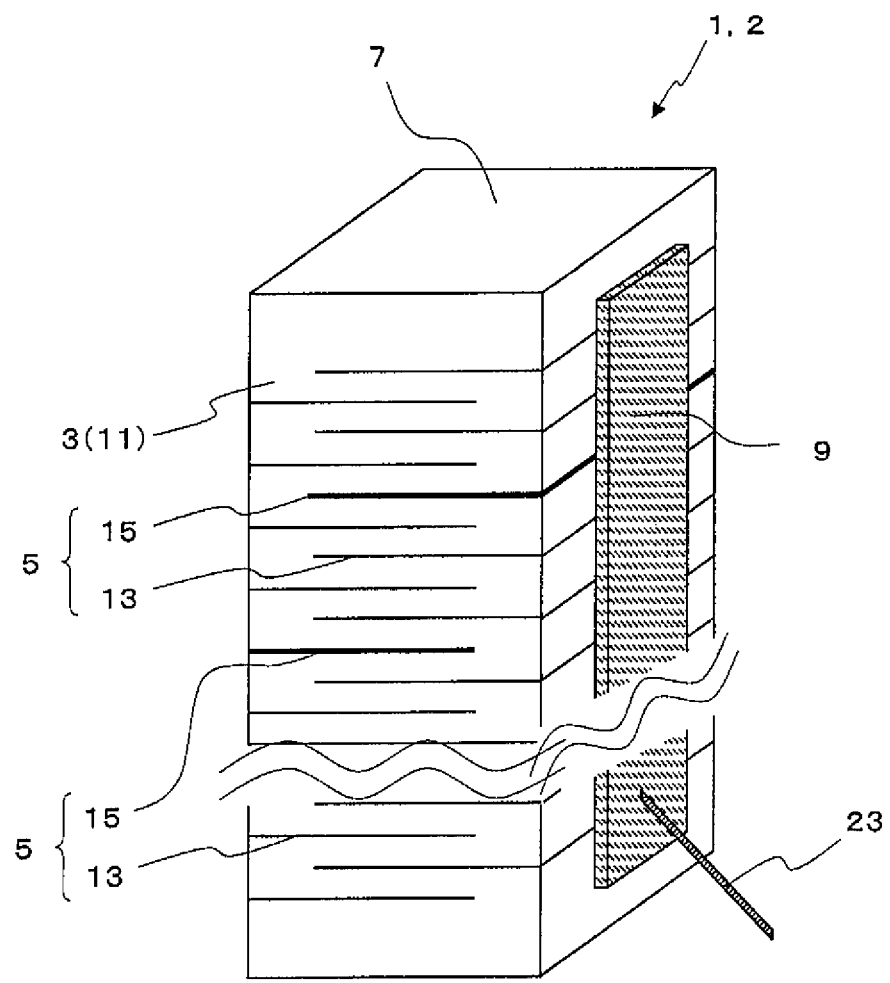
FIG. 1 is a perspective view showing an example of embodiment of multi-layer piezoelectric element according to the present invention.

| Description of Reference Numerals | |
|---|---|
| 1, 2: | Multi-layer piezoelectric element |
| 3: | Piezoelectric material layer |
| 5: | Metal layer |
| 7: | Multi-layer structure |
| 9: | External electrode |
| 11: | Piezoelectric crystal grains |
| 13: | Internal electrode |

-continued

Description of Reference Numerals

| | |
|---|---|
| 15: | Low-rigidity metal layer |
| 17: | Void |
| 19: | Metal part |
| 21: | Bonding material |
| 23: | Power supply section |
| 25: | Ejection apparatus |
| 27: | Ejection hole |
| 29: | Housing |
| 31: | Needle valve |
| 33: | Fuel passage |
| 35: | Cylinder |
| 37: | Piston |
| 39: | Belleville spring |
| 41: | Fuel ejection system |
| 43: | Common rail |
| 45: | Pressure pump |
| 47: | Ejection control unit |
| 49: | Fuel tank |

DETAILED DESCRIPTION OF THE PREFERRED EMBODIMENTS

Figure 2:
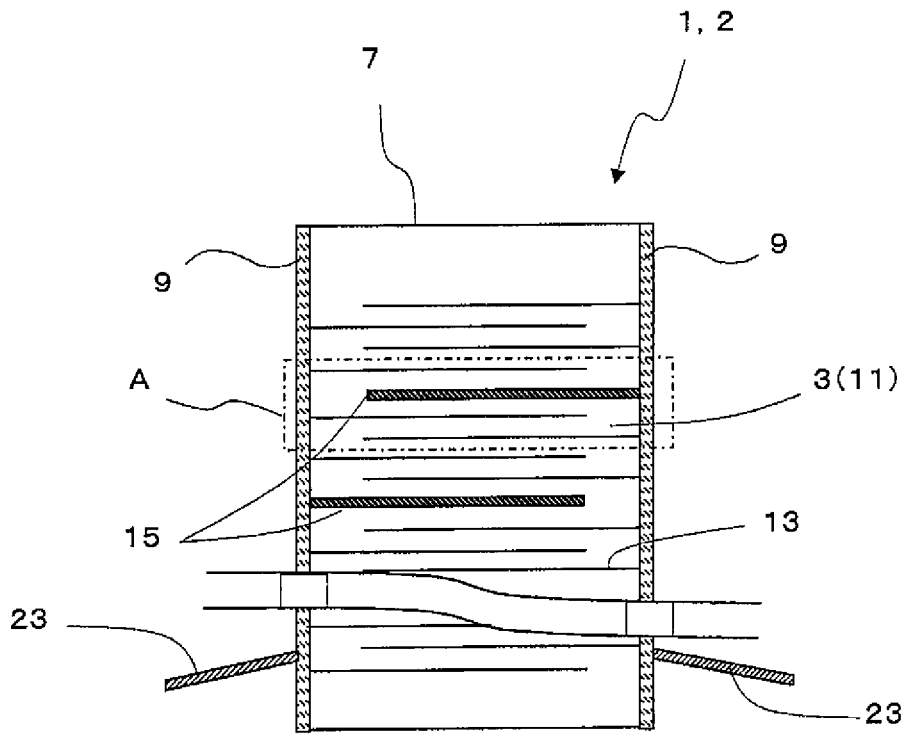
FIG. 2 shows an example of embodiment of the multi-layer piezoelectric element according to the present invention, in a sectional view along a direction parallel to the stacking direction.
Figure 3:
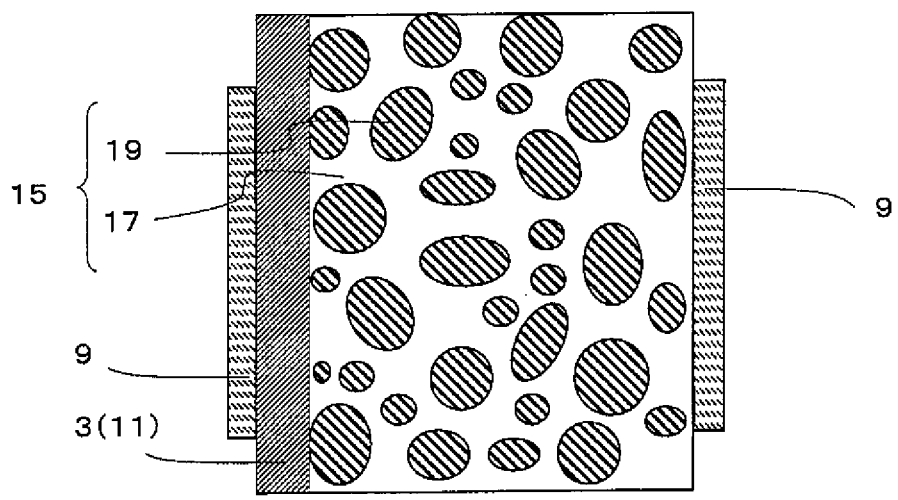
FIG. 3 shows an example of embodiment of the multi-layer piezoelectric element according to the present invention, in a sectional view that includes low-rigidity metal layer along a direction perpendicular to the stacking direction.

The present invention will be described below by way of embodiments and modifications thereof with reference to the accompanying drawings. FIG. 1 is a perspective view showing an example of embodiment of first and second multi-layer piezoelectric elements of the present invention. FIG. 2 shows the multi-layer piezoelectric element according to the embodiment shown in FIG. 1, in a longitudinal sectional view parallel to the stacking direction. FIG. 3 shows the multi-layer piezoelectric element according to the embodiment shown in FIG. 1, in a cross sectional view that includes a low-rigidity metal layer along a direction perpendicular to the stacking direction.

First Embodiment

As shown in FIG. 1 to FIG. 3, the multi-layer piezoelectric element 1 (this may hereafter be referred to also as element 1) of the first embodiment comprises a multi-layer structure 7 in which a plurality of piezoelectric material layer 3 and a plurality of metal layers 5 are stacked alternately one on another and external electrodes 9 formed on the side faces of the multi-layer structure 7. Each of the piezoelectric material layers 3 comprises a plurality of piezoelectric crystal grains 11. The plurality of metal layers 5 comprise internal electrodes 13 that are electrically connected to the external electrode 9 and low-rigidity metal layers 15 that have rigidity lower than those of the internal electrodes 13 and the piezoelectric material layer 3.

In the first embodiment, the low-rigidity metal layer 15 is a layer of lower rigidity that has weaker bonding strength within the layer and/or between the adjacent layers compared to the piezoelectric material layer 3 and the internal electrode 13, and comprises a plurality of metal parts 19 that are separated from each other. There exist, for example, voids 17 between the metal parts 19. Ceramics or resin may also exist, instead of the voids 17, between the metal parts 19. Thus the low-rigidity metal layer 15 of the present invention may have various forms.

According to the first embodiment, stress is absorbed by the low-rigidity metal layer 15 when the multi-layer piezoelectric element 1 is subjected to a strong extraneous impact or stress during operation of the multi-layer piezoelectric element 1. Therefore cracks are suppressed from occurring in the internal electrodes 13 and in the piezoelectric material layers 3, thereby suppressing short-circuiting from occurring between the internal electrodes 13 that adjoin each other in the stacking direction.

When the multi-layer piezoelectric element 1 is subjected to a stress greater than a certain level, the low-rigidity metal layer is preferentially broken. Since breaking of the low-rigidity metal layer mitigates the stress, it is made possible to suppress the internal electrodes and the piezoelectric material layers from being damaged even when a greater stress is generated.

Comparison of rigidity among the low-rigidity metal layer 15, the piezoelectric material layer 3 and the internal electrode 13 can be easily done by, for example, applying a load to the element in a direction perpendicular to the stacking direction. Specifically, a load may be applied to the element in a direction perpendicular to the stacking direction according to the procedure of JIS 3-point bending test (JIS R 1601). What is needed is simply locate the position where fracture occurs in the element 1 during the test, and the position of fracture is where rigidity is the lowest in the element.

The multi-layer piezoelectric element 1 of the first embodiment comprises the low-rigidity metal layer 15, and therefore fracture occurs preferentially in the low-rigidity metal layer 15 or in the interface between the low-rigidity metal layer 15 and the piezoelectric material layer 3, rather than in the piezoelectric material layer 3 and in the internal electrode 13 during the JIS 3-point bending test. Thus evaluation can be done by observing where fracture takes place, whether in the piezoelectric material layer 3 and in the internal electrode 13, or, in the low-rigidity metal layer 15 and in the interface between the low-rigidity metal layer 15 and the piezoelectric material layer 3.

Since it suffices to observe where fracture takes place in the element, problem of a test piece that is too small to be subjected to the JIS 3-point bending test can be circumvented by preparing such a test piece as the element has a square prism shape according to the JIS 3-point bending test, placing the test piece across two supports disposed at a predetermined distance from each other, and applying a load at the center between the supports.

Low rigidity means a low Young's modulus. Young's modulus may be measured by, for example, nano-indentation method. Nano-Indenter II of Nano-Instrument Inc., for example, may be used in the measurement. Young's modulus may be measured with this instrument by exposing the low-rigidity metal layer 15, the piezoelectric material layer 3 or the internal electrode 13 in a surface cut in a plane perpendicular or parallel to the stacking direction of the multi-layer structure 7.

Figure 4:
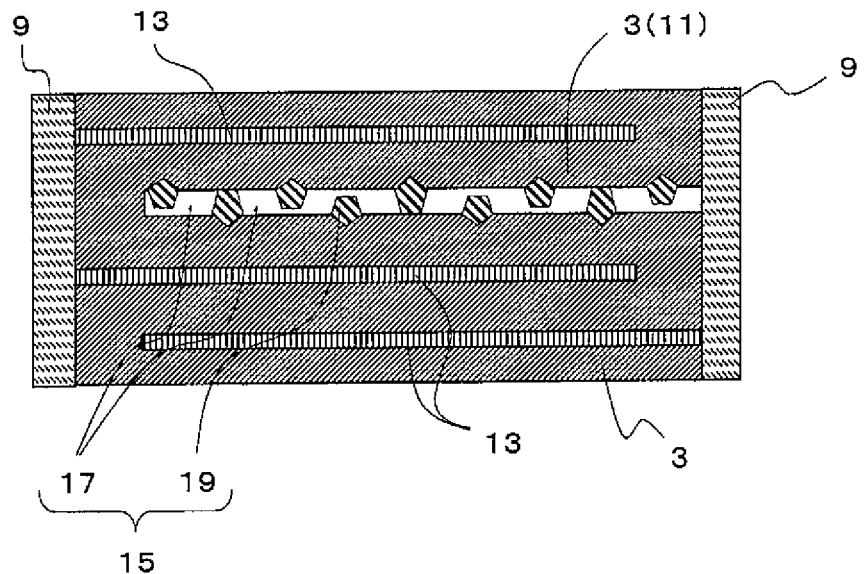
FIG. 4 is an enlarged sectional view of a region A in first multi-layer piezoelectric element 1 according to the first embodiment of the present invention.

FIG. 4 is an enlarged sectional view of a portion A where the low-rigidity metal layer is disposed in the first multi-layer piezoelectric element according to the first embodiment shown in FIG. 2. As shown in FIG. 4, the low-rigidity metal layer 15 comprises the voids 17 and a plurality of metal parts 19 that are separated from each other by the voids 17. Since the low-rigidity metal layer 15 has such a constitution, bonding strength is low within the low-rigidity metal layer 15 and/or with the adjacent piezoelectric material layer 3, and therefore rigidity of the low-rigidity metal layer 15 can be made lower.

Furthermore, when the multi-layer piezoelectric element 1 is subjected to stress, the stress is absorbed as the piezoelectric crystal grains 11 that are in contact with the metal part 19 deform. The piezoelectric crystal grains 11 can transform the stress absorbed thereby into heat and dissipate the heat. At this time, heat can be dissipated efficiently through the metal part 19, since the piezoelectric crystal grains 11 make contact with the metal parts 19.

Also because a plurality of metal parts 19 are separated from each other, growing of cracks in unexpected directions can be controlled. It is preferable that the low-rigidity metal layers 15 are formed all over the entire surface in a cross section of the multi-layer piezoelectric element 1, the cross section that is perpendicular to the stacking direction and includes the low-rigidity metal layers 15. Forming the low-rigidity metal layers 15 in this way enables it to achieve the effect of relieving the stress acting in various directions.

Figure 5:
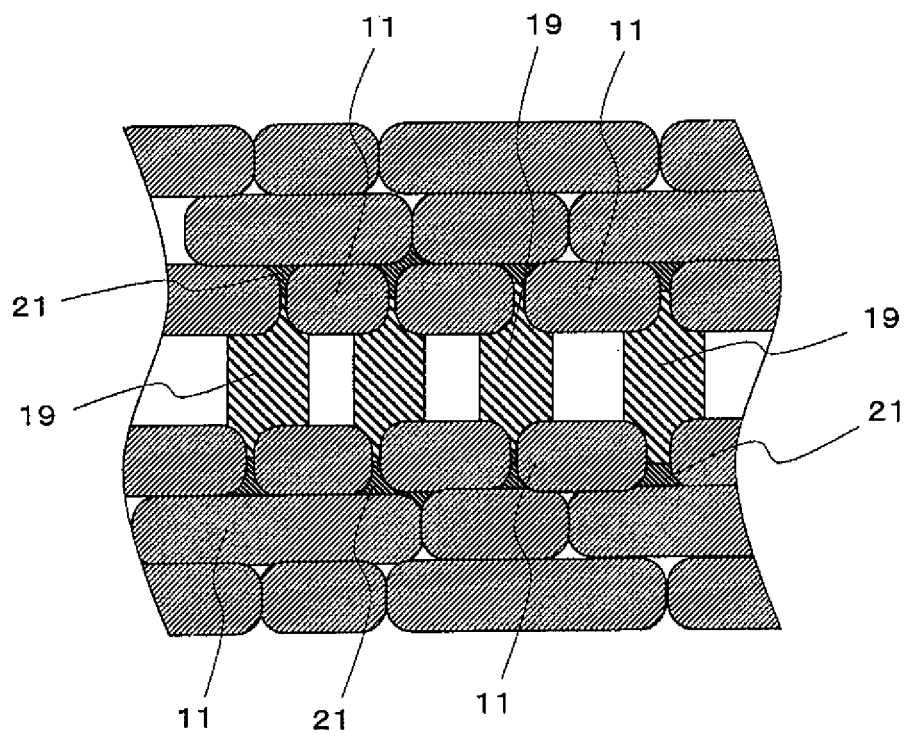
FIG. 5 is an enlarged sectional view showing the bonding between metal part and piezoelectric material layer in second multi-layer piezoelectric element 2 according to the second embodiment of the present invention.

FIG. 5 is an enlarged sectional view showing the bonding between the metal parts 19 and the piezoelectric material layer in the multi-layer piezoelectric element of the first embodiment shown in FIG. 4. As shown in FIG. 5, the end of at least one of the metal parts 19 infiltrates between the piezoelectric crystal grains 11 that adjoin each other, in the first embodiment. This improves durability of the piezoelectric layer 3. This is because, as mentioned already, the contact area between the metal parts 19 and the piezoelectric crystal grains 11 increases, thus enabling it to dissipate the heat from the piezoelectric crystal grains 11 through the metal parts 19. In order to increase bonding between the metal parts 19 and the piezoelectric crystal grains 11, it is more preferable that the portion of the metal parts 19 that infiltrates between the piezoelectric crystal grains 11 has wedge shape.

In case the multi-layer piezoelectric element 1 is to operate with a greater amount of displacement, it is preferable to decrease bonding between the metal parts 19 and the piezoelectric crystal grains 11 so that the metal part 19 and the piezoelectric crystal grains 11 depart from each other when the element is energized. The metal parts 19 formed in this way enable greater amount of displacement as the end of the metal parts 19 that infiltrates between the piezoelectric crystal grains 11 comes off when the element is subjected to tensile stress.

Second Embodiment

The second multi-layer piezoelectric element 2 according to the second embodiment of the present invention will be described in detail below with reference to the accompanying drawings. As shown in FIG. 1 to FIG. 5, the multi-layer piezoelectric element 2 of the second embodiment comprises the multi-layer structure 7 in which a plurality of piezoelectric material layers 3 and a plurality of metal layers 5 are stacked alternately one on another, and the external electrodes 9 formed on the side faces of the multi-layer structure 7, similarly to the first embodiment. The plurality of metal layers 5 comprise the internal electrodes 13 that are electrically connected to, the external electrodes 9 and the low-rigidity metal layers 15 that have rigidity lower than those of the internal electrodes 13 and the piezoelectric material layer 3.

In the second embodiment, the low-rigidity metal layer 15 is a layer of low rigidity that has weaker bonding strength within the layer and/or between the adjacent layers compared to the piezoelectric material layer 3 and the internal electrode 13, similarly to the case of the first multi-layer piezoelectric element 1 according to the first embodiment of the present invention previously described.

The piezoelectric material layer 3 in the multi-layer piezoelectric element 2 of the second embodiment is different from that of the multi-layer piezoelectric element 1 of the first embodiment, in that it comprises a plurality of piezoelectric crystal grains 11 and a bonding material 21 that is disposed between the plurality of piezoelectric crystal grains 11 and bonds the adjacent piezoelectric crystal grains 11. In the multi-layer piezoelectric element 2 of the second embodiment, the end of the metal part 19 is bonded with the piezoelectric crystal grains 11 via the bonding material 21. Bonding of the piezoelectric crystal grains 11 with each other by the bonding material 21 enables it to disperse the stress acting on the metal part 19 over a wider region of the piezoelectric material layer 3 that is even not in contact with the metal part 19. Bonding of the metal parts 19 with the piezoelectric crystal grains 11 via the bonding material 21 also enables it to increase the bonding between the metal parts 19 and the piezoelectric material layer 3, and therefore position of the metal part 19 can be stabilized.

In the multi-layer piezoelectric element 2 of the second embodiment comprising as described above, stress is absorbed by the low-rigidity metal layer 15 when the multi-layer piezoelectric element 2 is subjected to a strong extraneous impact or stress during operation of the multi-layer piezoelectric element 2, similarly to the case of the first embodiment. Thus it is made possible to suppress cracks from occurring in the internal electrodes 13 and in the piezoelectric material layer 3, thereby suppressing short-circuiting from occurring between the internal electrodes 13 that adjoin each other in the stacking direction.

Also when the multi-layer piezoelectric element 1 is subjected to a stress greater than a certain level, the low-rigidity metal layer is preferentially broken, thereby relieving the stress. Thus it is made possible to suppress the internal electrodes and the piezoelectric material layers from being damaged even when a greater stress is generated.

In the second embodiment, it is preferable that the end of at least one of the metal parts 19 infiltrates between the piezoelectric crystal grains 11 that adjoin each other. This is because infiltration of the end of the metal part 19 between the piezoelectric crystal grains 11 that adjoin each other increases the heat dissipation from the piezoelectric crystal grains 11 through the metal part 19.

In the second embodiment, the metal parts 19 are formed mainly from a metal. Thus the metal parts 19 may either be constituted from metal component only, or contain ceramic or glass component. The bonding material 21 may be any material that can bond well with the metal parts 19 and the piezoelectric crystal grains 11, such as glass or lead.

It is preferable that the bonding material 21 contains glass as a main component. This is because a glass component bonds well with the metal parts 19 and the piezoelectric material layer 3, and therefore using the bonding material 21 that contains glass as a main component improves the bonding between the bonding material 21 and the metal parts 19. Thus the metal parts 19 can be bonded more firmly with one side of the piezoelectric material layer 3. The main component mentioned above means a component of the highest concentration in terms of weight percentage, among the components contained. Amorphous state characteristic to glass may be analyzed by using X-ray diffraction analysis (XRD) or a transmission electron microscope (TEM).

It is also preferable that the bonding material 21 contains the main component of the metal part 19. This is because inclusion of the main component of the metal part 19 causes the metal parts 19 and the main component of the metal part 19 contained in the bonding material 21 to bond with each other, thus generating anchoring effect. This further improves the bonding between the metal parts 19 and the piezoelectric crystal grains 11 via the bonding material 21.

It is further preferable that the bonding material 21 contains oxide of the main component of the metal part 19. This is because inclusion of oxide of the main component of the metal part 19 causes the metal parts 19 and the bonding material 21 to bond with each other by ionic bond that is stronger than metallic bond, thus further improving the bonding between the metal parts 19 and the piezoelectric crystal grains 11 via the bonding material 21.

The main component of the glass is preferably silicon oxide. This is because silicon oxide and the oxide of the main component of the metal part 19 form a liquid phase when the multi-layer piezoelectric element 2 is formed by firing, thereby accelerating the sintering process and improves affinity with the metal part 19 as well. This enables it to concentrate the bonding material 21 selectively in a surface region of the piezoelectric material layer 3 that makes contact with the metal part 19, as shown in FIG. 5.

Modification

Figure 6:
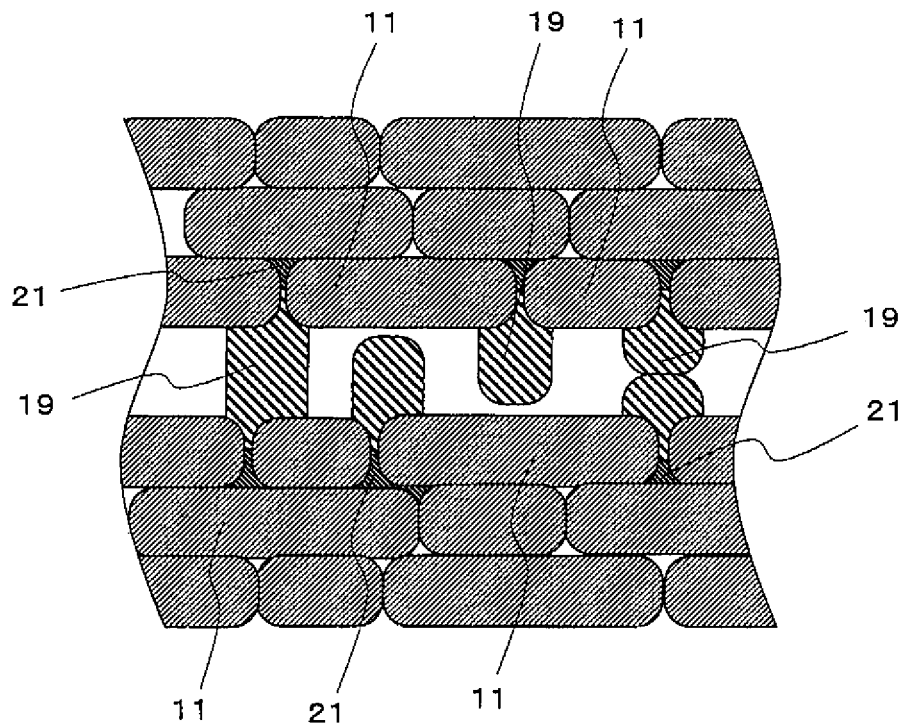
FIG. 6 is an enlarged sectional view showing the bonding between metal part and piezoelectric material layer in a multi-layer piezoelectric element of a modification of the present invention.
Figure 7:
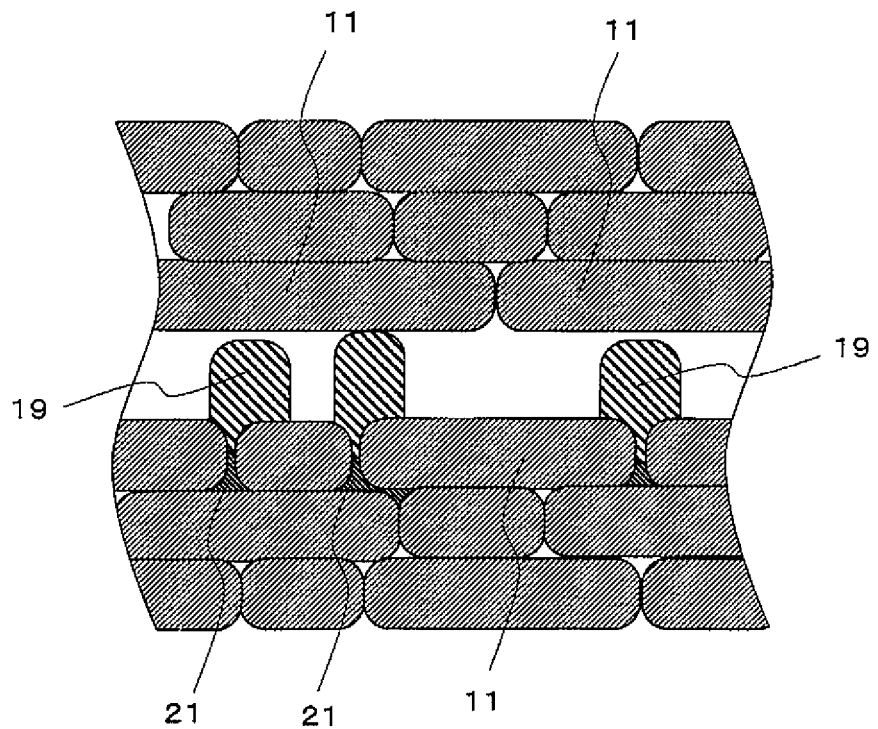
FIG. 7 is an enlarged sectional view showing the bonding between metal part and piezoelectric material layer in a multi-layer piezoelectric element of another modification of the present invention, different from that of FIG. 6.
Figure 8:
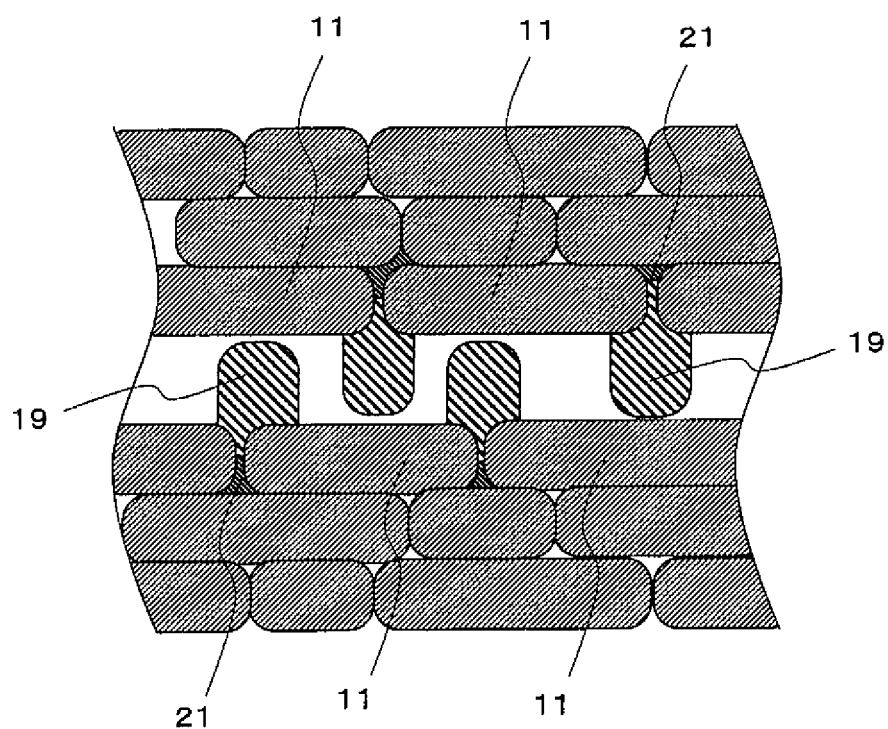
FIG. 8 is an enlarged sectional view showing the bonding between metal part and piezoelectric material layer in a multi-layer piezoelectric element of another modification of the present invention, different from those of FIG. 6 and FIG. 7.

FIG. 6 to FIG. 8 are drawings of modification and preferable example of the multi-layer piezoelectric element according to the present invention.

In the multi-layer piezoelectric element according to the present invention, it is preferable that the metal part 19 is bonded with only one piezoelectric material layer 3 among the two piezoelectric material layers 3 that adjoin in the stacking direction as shown in FIG. 6 to FIG. 8. That is, at least one of the metal parts 19 of the multi-layer piezoelectric element 1 of this preferable embodiment is bonded with only one piezoelectric material layer 3 and is not bonded with the other piezoelectric material layer 3. In case all of the metal parts 19 are bonded with the piezoelectric material layers 3 located on both sides, the piezoelectric material layers 3 that adjoin in the stacking direction are restricted with a strong force. This may cause stress to concentrate in the vicinity of the bonding interface between the piezoelectric material layer 3 and the metal part 19 at the instance when the metal part 19 fractures. The stress concentration in the vicinity of the bonding interface between the piezoelectric material layer 3 and the metal part 19 at the instance are controlled in this preferable embodiment when the metal part 19 fractures.

It is also preferable that at least one of the metal parts 19 is bonded with only the piezoelectric crystal grains 11 of one piezoelectric material layer 3 via the bonding material 21, among the two piezoelectric material layers 3 that adjoin in the stacking direction. In other words, it is preferable that at least one of the metal parts 19 is bonded with only the piezoelectric crystal grains 11 of one piezoelectric material layer 3 and is not bonded with the other piezoelectric material layer 3. Forming the metal part 19 in this constitution increases the amount of displacement of the multi-layer piezoelectric elements 1, 2. In case all of the metal parts 19 are bonded with the piezoelectric material layers 3 on both sides, the piezoelectric material layers 3 that adjoin in the stacking direction are restricted with a strong force. As a result, the piezoelectric material layer 3 may be unable to undergo sufficient piezoelectric displacement to achieve a greater amount of displacement. There is also a possibility of the stress concentrated in the vicinity of the bonding interface between the piezoelectric material layer 3 and the metal part 19 at the instance when the metal part 19 fractures.

In case a part of the metal part 19 is not bonded with the other piezoelectric material layer 3 as described above, in contrast, the force that restricts the piezoelectric material layers 3 that adjoin in the stacking direction can be lessened. As a result, it is made possible to suppress fracture of the piezoelectric material layer 3 and peel-off of the piezoelectric material layer 3 in a portion thereof that is bonded with the metal part 19. In case the element is subjected to a tensile stress, void is generated between the piezoelectric material layer 3 and the metal part 19 that is not bonded with the piezoelectric material layer 3, so that the stress is relieved by the void.

In case the element 1 is subjected to a compressive stress, the metal parts 19 are not bonded with the piezoelectric material layer 3 and are therefore not restricted by the piezoelectric material layer 3, stress can be suppressed from concentrating in the vicinity of the interface between the piezoelectric material layers 3 and the metal parts 19. As a result, it is made possible to provide the multi-layer piezoelectric element 1 of high reliability that operates stably.

It can be determined whether the metal part 19 is bonded with the piezoelectric material layers 3 on one side and the other side thereof or not, by conducting the JIS 3-point bending test described previously, or a 3-point bending test based on the JIS 3-point bending test, and observing the fracture surface. In the multi-layer piezoelectric elements 1, 2 of this embodiment, since the low-rigidity metal layer 15 is lower in rigidity than the piezoelectric material layer 3 and the internal electrodes 13, fracture occurs within the low-rigidity metal layer 15 and/or in the interface between adjacent layers when the 3-point bending test is conducted.

In case the metal part 19 is bonded with the piezoelectric material layers 3 on both sides, stress is concentrated in the vicinity of a portion of the piezoelectric material layer 3 that is bonded with the metal part 19 at the instance when the metal part 19 fractures, thus resulting in cracks taking place in the piezoelectric material layer 3 or peel-off in the bonding interface between the piezoelectric material layer 3 and the metal part 19. In the multi-layer piezoelectric elements 1, 2 of this preferred embodiment, the metal part 19 is bonded with the piezoelectric material layer 3 only on one side, and therefore peel-off is suppressed from occurring in the bonding interface between the piezoelectric material layer 3 and the metal part 19. The performance can be evaluated by checking to see whether a part of the piezoelectric material layer 3 that has peeled off is bonded with the metal part 19 which is exposed in the fractured surface.

The phrase "one of the piezoelectric material layers 3" means one of the two piezoelectric material layers 3 that adjoin any of the metal parts 19 in the stacking direction. Accordingly, either all of the metal parts 19 contained in one low-rigidity metal layer 15 may be bonded with only one (the lower piezoelectric material layer 3 in the case shown in FIG. 7) of the two piezoelectric material layers 3 that adjoin in the stacking direction as shown in FIG. 7, or a plurality of the metal parts 19 contained in the low-rigidity metal layer 15 may be bonded with different piezoelectric material layer 3 among the two piezoelectric material layers 3 that adjoin in the stacking direction as shown in FIG. 8. FIG. 8 is an enlarged sectional view showing another example of the multi-layer piezoelectric element 1 of the embodiment of the present invention.

As shown in FIG. 6 to FIG. 8, it is preferable that at least one of the metal parts 19 is separated from the other piezoelectric material layer 3 among the two piezoelectric material layers 3 that adjoin in the stacking direction. Thus durability of the piezoelectric material layer 3 can be improved by setting the metal parts 19 separated from the other piezoelectric material layer 3.

This is for the following reason. The multi-layer piezoelectric elements 1, 2 are used to repeat expansion and contraction by energizing repetitively. Therefore, when the metal part 19 is not separated from the other piezoelectric material layer 3 but in contact therewith, the metal parts 19 and the other piezoelectric material layer 3 hit each other repetitively when the multi-layer piezoelectric elements 1, 2 are operated continuously. However, when the metal part 19 is separated from the other piezoelectric material layer 3, such a hitting action can be suppressed so that the piezoelectric material layer 3 can be suppressed from being damaged and durability can be improved.

It is preferable that the metal part 19 is bonded with two or more piezoelectric crystal grains 11 of one piezoelectric material layer 3. This is because the effect of dispersing the stress in the piezoelectric material layer 3 can be enhanced by bonding one end of the metal part 19 with two or more piezoelectric crystal grains 11. It is also made possible to suppress concentration of stress in one piezoelectric crystal grain 11 which would make a starting point for new crack developing from damage of the piezoelectric crystal grain 11.

A method for manufacturing the multi-layer piezoelectric elements 1, 2 of this embodiment will be described below.

First, ceramic green sheets that would become the piezoelectric material layers 3 are formed. Then a calcined powder of a piezoelectric ceramic material, a binder made of an organic polymer such as an acrylic or butyral resin and a plasticizer are mixed to form a slurry. The slurry is formed into the ceramic green sheets by a known method such as doctor blade process or calender roll process, or other tape molding method. The piezoelectric ceramic material is required only to have piezoelectric characteristics, and perovskite type oxide such as $PbZrO_3$—$PbTiO_3$ may be used. For the plasticizer, DBP (dibutyl phthalate) or DOP (dioctyl phthalate) or the like may be used.

Then an electrically conductive paste used to form the metal layer 5 is prepared. Specifically, a metal powder such as silver-palladium is mixed with the binder and the plasticizer to prepare the electrically conductive paste. The electrically conductive paste is applied over the entire surface by screen printing process, and is fired to form the internal electrode 13 as will be described later.

While the internal electrode 13 can be formed by firing the electrically conductive paste, the low-rigidity metal layer 15 comprising the metal parts 19 that are separated from each other can be formed by mixing an evaporative component such as acrylic beads or carbon in the electrically conductive paste. The metal parts 19 that are separated from each other can be formed by applying the electrically conductive paste, that contains the evaporative component mixed therein, onto the ceramic green sheet by screen printing process, as the evaporative component evaporates in the processes of firing and degreasing.

The method of forming the metal parts 19 that are separated from each other is not limited to that described above. For example, the metal parts 19 can be formed by changing the mesh size of the screen or the pattern configuration. Specifically, if mesh size of the screen is set to 15 μm or less, the amount of ink paste that passes the screen decreases to cause a blurred pattern, so that the metal parts 19 that are separated from each other can be formed. The metal parts 19 that are separated from each other can also be formed by masking the screen to decrease the amount of ink paste that passes the screen. The masking configuration is preferably near round shape such as oval or circle, which has the effect of stress relieving.

With the bonding material 21 mixed in one of the two ceramic green sheets that would become the two piezoelectric material layers 3 that adjoin the low-rigidity metal layer 15 in the stacking direction, the metal part 19 can be formed so as to be bonded with only one piezoelectric material layer 3 among the two piezoelectric material layers 3 that adjoin in the stacking direction as shown in FIG. 7.

The metal part 19, which is bonded with only one piezoelectric material layer 3 among the two piezoelectric material layers 3 that adjoin in the stacking direction, can be formed by a process described below, instead of the process described above. That is, when applying the electrically conductive paste that would make the low-rigidity metal layer 15 and stacking the ceramic green sheets that would become the piezoelectric material layers 3 that adjoin the low-rigidity metal layer 15 in the stacking direction, a paste that contains the bonding material 21 is applied between one of the ceramic green sheets and the electrically conductive paste. Stacking one of the ceramic green sheets on the electrically conductive paste via the paste that contains the bonding material 21 enables it to form the metal part 19 that is bonded with only one piezoelectric material layer 3 among the two piezoelectric material layers 3 that adjoin in the stacking direction.

Alternatively, with a component that lowers the wettability with the low-rigidity metal layer 15 mixed in the other one of the two green sheets that would become the two piezoelectric material layers 3 that adjoin the low-rigidity metal layer 15 in the stacking direction, the metal part 19 can also be formed so as to be bonded with only one piezoelectric material layer 3 among the two piezoelectric material layers 3 that adjoin in the stacking direction as shown in FIG. 5. BN or carbon may be used as the component that lowers the wettability with the low-rigidity metal layer 15. By employing the method of using the component that lowers the wettability with the low-rigidity metal layer 15, it is made possible to form the metal part 19 that is bonded with only one piezoelectric material layer 3, even when the two ceramic green sheets that would become the two piezoelectric material layer 3 that adjoin the low-rigidity metal layer 15 in the stacking direction do not contain the bonding material 21.

By mixing the bonding material 21 in the two ceramic green sheets that would become the two piezoelectric material layers 3 that adjoin the low-rigidity metal layer 15 in the stacking direction, it is made possible to form the metal part 19 that is each bonded with only one piezoelectric material layer 3 among the two piezoelectric material layers 3 that adjoin in the stacking direction as shown in FIG. 8.

By mixing the bonding material 21 in the electrically conductive paste that forms the low-rigidity metal layer 15, it is made possible to form the metal part 19 in such a way that each is bonded with both the piezoelectric material layers 3 that adjoin in the stacking direction. Particularly when silver-palladium alloy is used as the electrically conductive paste that forms the metal layer 5 and the silver content of the electrically conductive paste that forms the low-rigidity metal layer 15 is set higher than that of the internal electrode 13, silver diffuses from the low-rigidity metal layer 15 to the adjacent metal layer 13 through the liquid phase component of the piezoelectric material layer 3 formed by firing, serving as a medium. As a result, the bonding material 21 that is mixed in the electrically conductive paste which forms the low-rigidity metal layer 15 becomes more likely to bond with the liquid phase component of the piezoelectric material layer 3, so that each of the metal part 19 is formed so as to be bonded with both the piezoelectric material layers 3 that adjoin in the stacking direction.

When the internal electrodes 13 are formed from silver-palladium alloy, the low-rigidity metal layer 15 can be formed without complicated processes, by using the electrically conductive paste that has a silver content in the silver-palladium alloy higher than that of the electrically conductive paste used to form the internal electrode 13, to form the low-rigidity metal layer 15.

This is because, when the multi-layer structure 7 is formed by placing the electrically conductive paste having higher silver content at a position where the low-rigidity metal layer 15 is to be formed and fired at the same time, silver diffuses out of the electrically conductive paste that has higher silver content. As the silver diffuses, a plurality of metal parts 19 that are separated from each other are formed, so that the electrically conductive paste having high silver content forms the low-rigidity metal layer 15 that has lower rigidity than those of the internal electrodes 13 and the piezoelectric material layer 3.

By mixing the bonding material 21 in the electrically conductive paste used to form the low-rigidity metal layer 15, it is made possible to efficiently bond the metal part 19 with the piezoelectric material layer 3 via the bonding material 21. This is because the bonding material 21 mixed in the electrically conductive paste diffuses along with silver. As previously mentioned, when the electrically conductive paste, that has higher silver content in the silver-palladium alloy than that of the electrically conductive paste used to form the internal electrode 13, is used to form the low-rigidity metal layer 15, silver diffuses out of the electrically conductive paste of higher silver content. As the silver diffuses, the bonding material 21 diffuses accordingly.

The bonding material 21 has higher tendency to bond with the piezoelectric crystal grains 11 than silver, and therefore bonds with the piezoelectric crystal grains 11 while diffusing. Then the bonding material 21 that has bonded with the piezoelectric crystal grains 11 bonds with the diffusing silver, so that the metal part 19 and the piezoelectric material layer 3 are bonded together via the bonding material 21.

When the metal part 19 and the piezoelectric material layer 3 are bonded together via the bonding material 21, silver and the bonding material 21 diffuse between the piezoelectric crystal grains 11, and therefore there is a high tendency that the end of the metal part 19 is formed in a configuration of infiltrating between the adjoining piezoelectric crystal grains 11. As a result, one end of the metal part 19 is wedge-shaped, thereby making the bonding between one end of the metal part 19 and the piezoelectric material layer 3 firmer.

In order to make the multi-layer piezoelectric element 1 having high durability, it is preferable that apart of the metal parts 19 is bonded with both of the two piezoelectric material layers 3 that adjoin in the stacking direction, via the bonding material 21 as shown in FIG. 6. When the metal part 19 is formed in this way, the two piezoelectric material layers 3 that adjoin in the stacking direction are connected via the metal part 19, and therefore shape of the multi-layer piezoelectric element 1 can be stably maintained.

The electrically conductive paste that would form the low-rigidity metal layer 15 is applied to a thickness of 1 to 40 μm on the top surface of the green sheet by screen printing process or the like. A plurality of green sheets having the electrically conductive paste printed thereon are stacked one on another, and are fired at a temperature from 200 to 800° C. so as to remove the binder. At this time, in order to form the voids 17 remain effectively between the metal parts 19, it is preferable to fire for degreasing at a temperature higher than the glass transition temperature (Tg point) of the evaporative component.

After degreasing, the stack is fired at a temperature from 900 to 1,200° C. so as to form the multi-layer structure 7. Setting the firing temperature to 900° C. or higher enables it to sinter the piezoelectric material layer 3 sufficiently, thus suppressing the displacement characteristic from being influenced. On the other hand, setting the firing temperature to 1,200° C. or lower results in the suppression of melting or decomposition of the low-rigidity metal layer 15, and therefore enables it to maintain the shape of the low-rigidity metal layer 15. When firing, it is preferable to maintain the temperature higher than the Tg point of the evaporative component, in order to form the voids 17 remain effectively between the metal parts 19.

Method for making the multi-layer structure 7 is not limited to that described above. Any method may be employed as long as the multi-layer structure 7 can be made in such a constitution as a plurality of piezoelectric material layers 3 and a plurality of metal layers 5 are stacked alternately one on another.

Then the external electrodes 9 are formed so as to establish electrical connection with the internal electrodes 13 of which ends are exposed on the side faces of the multi-layer structure 7. The external electrodes 9 can be formed by adding a binder to a glass powder to prepare a silver-glass electrically conductive paste, printing the electrically conductive paste and firing.

Then the multi-layer structure 7 whereon the external electrodes 9 are formed is dipped in a resin solution that contains silicone rubber. The silicone resin solution is deaerated in vacuum thereby having the external surface of the multi-layer structure 7 covered by the silicone resin. The multi-layer structure 7 is then pulled up from the silicone resin solution, with the side faces of the multi-layer structure 7 coated with the silicone resin (not shown). Then lead wires are connected as power supply section 23 by means of an electrically conductive adhesive (not shown) or the like onto the external electrodes 9.

Then DC electric voltage is applied in a range from 0.1 to 3 kV/mm across a pair of external electrodes 9 via the lead wires so as to carry out polarization treatment of the multi-layer structure 7, thereby to complete the multi-layer piezoelectric element 1 of this embodiment. When the lead wires are connected to an external power supply (not shown) and a voltage is applied to the internal electrodes 13 via the lead wires serving as the power supply section 23 and through the external electrodes 9, the piezoelectric material layers 3 can undergo a large displacement by the reverse piezoelectric effect. Thus the element is capable of functioning as an automobile fuel ejection valve that supplies fuel to an engine.

An electrical conductivity assisting member (not shown), formed from a metal mesh or a mesh-like metal sheet may be embedded in the electrically conductive adhesive. Embedding the electrical conductivity assisting member in the electrically conductive adhesive makes it possible to supply a large current flowing through the electrical conductivity assisting member so as to suppress an excessive current from flowing in the external electrodes 9 even when the element is operated at a high speed. As a result, local heating which may lead to breakage of the external electrode 9 can be effectively prevented from occurring, thereby significantly improving the durability.

When the metal mesh or mesh-like metal sheet is embedded in the electrically conductive adhesive, possibility of cracks occurring in the electrically conductive adhesive can be decreased. The metal mesh may be a structure of entwined metal wires, and the mesh-like metal sheet may be a metal sheet with a number of holes punched therethrough.

An ejection apparatus 25 according to one embodiment of the present invention will be described below.

Figure 9:
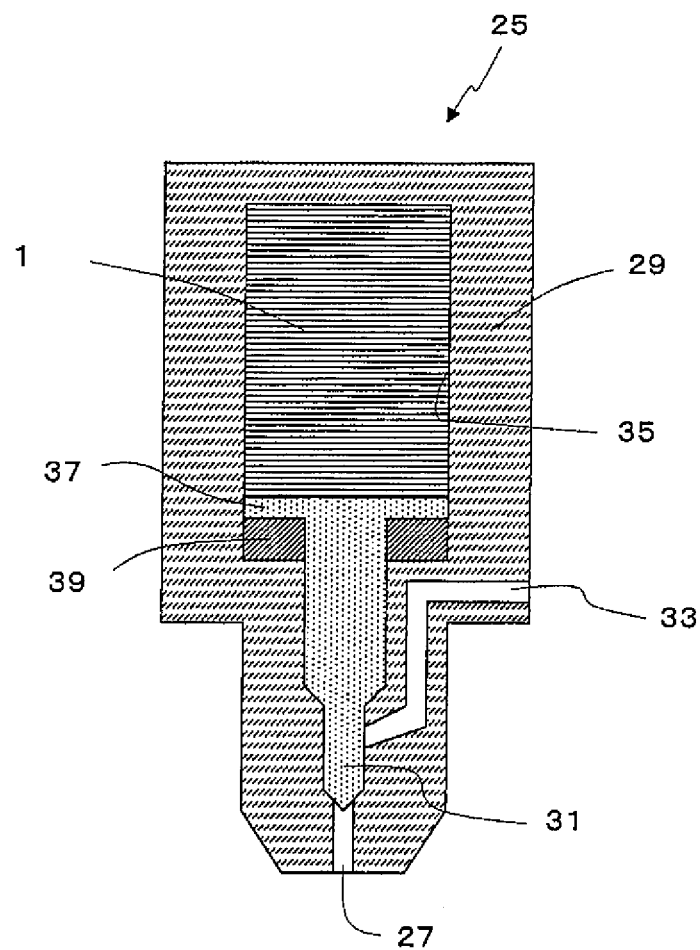
FIG. 9 is a sectional view showing an ejection apparatus of the present invention.

FIG. 9 is a schematic sectional view of the ejection apparatus 25 according to one embodiment of the present invention. As shown in FIG. 9, the ejection apparatus 25 of this embodiment comprises the multi-layer piezoelectric element 1 represented by the embodiment described above housed in a housing 29 that comprises an ejection hole 27 formed at one end thereof. The housing 29 further comprises a needle valve 31 that can open or close the ejection hole 27 disposed therein. Connected to the ejection hole 27 is a fuel passage 33 that is capable of communicating therewith in response to the action of the needle valve 31. The fuel passage 33 is connected to a fuel source provided outside, so that a fuel is supplied through the fuel passage 33 at a constant pressure that is always high. Accordingly, when the needle valve 31 opens the ejection hole 27, the fuel supplied to the fuel passage 33 is ejected at a high constant pressure into a fuel chamber of an internal combustion engine which is not shown.

The needle valve 31 comprises an upper end where the inner diameter is made larger and a piston 37 is disposed so as to be capable of sliding in a cylinder 35 formed in the housing 29. The multi-layer piezoelectric element 1 described above is housed in the housing 29.

With the ejection apparatus 25 as described above, when the multi-layer piezoelectric element 1 is caused to expand by applying a voltage thereto, the piston 37 is pressed so that the needle valve 31 plugs the ejection hole 27 and shuts off the fuel supply. When the voltage is removed, the multi-layer piezoelectric element 1 contracts and a Belleville spring 39 presses back the piston 37 so that the ejection hole 27 communicates with the fuel passage 33 thereby allowing the fuel to be ejected.

The ejection apparatus 25 of this embodiment may also comprises constituted from the housing that comprises the ejection 27 and the multi-layer piezoelectric element 1, so that the liquid that fills the housing is discharged through the ejection hole 27 by the operation of the multi-layer piezoelectric element 1. That is, the multi-layer piezoelectric element 1 may not necessarily be in the inside of the housing. The only requirement is that pressure can be applied to the inside of the housing by the operation of the multi-layer piezoelectric element 1. In this embodiment, the liquid may be a fuel, ink or various other fluid such as electrically conductive paste.

A fuel ejection system 41 according to one embodiment of the present invention will be described below.

Figure 10:
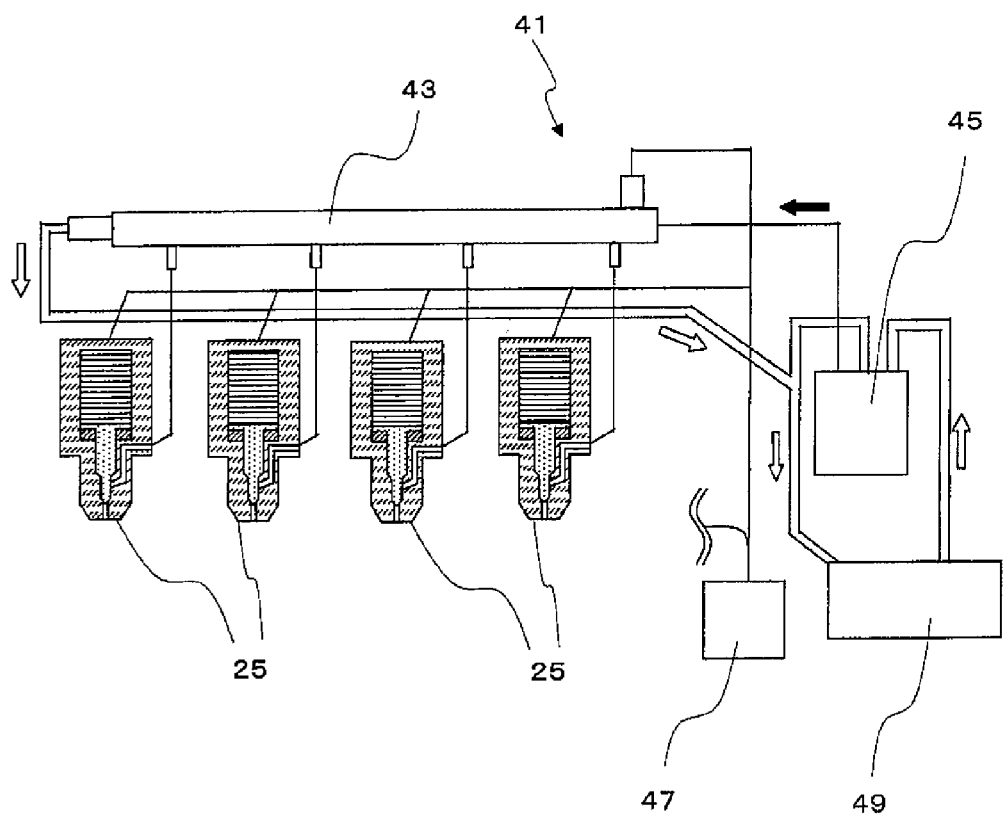
FIG. 10 is a schematic diagram showing a fuel ejection system according to one embodiment of the present invention.

FIG. 10 is a schematic diagram showing the fuel ejection system 41 according to one embodiment of the present invention. As shown in FIG. 10, the fuel ejection system 41 of this embodiment comprises a common rail 43 that stores a high-pressure fuel, a plurality of the ejection apparatuses 25 that eject the fuel stored in the common rail 43, a pressure pump 45 that supplies the high-pressure fuel to the common rail 43 and an ejection control unit 47 that supplies a drive signal to the ejection apparatuses 25.

The ejection control unit 47 controls the quantity and timing of fuel ejection while monitoring the condition in the combustion chamber of an engine with sensors and the like. The pressure pump 45 delivers the fuel from the fuel tank 49 to the common rail 43 by boosting the pressure to a level in a range from 1,000 to 2,000 atm, preferably from 1,500 to 1,700 atm. The common rail 43 stores the fuel supplied from the pressure pump 45, and sends it to the ejection apparatuses 25 as required. The ejection apparatus 25 ejects a small amount of the fuel through the ejection hole 27 in the form of mist into the combustion chamber.

The present invention relates to the multi-layer piezoelectric element, the ejection apparatus 25 and the fuel ejection system 41, although the present invention is not limited to the embodiment described above. The present invention can be applied to various applications as, for example, drive element used in a fuel ejection apparatus of automobile engine, liquid ejection apparatus of ink jet printer, precision positioning device or vibration preventing device for an optical apparatus or the like, sensor element mounted in combustion pressure sensor, knocking sensor, acceleration sensor, load sensor, ultrasound sensor, pressure sensor, yaw rate sensor or the like, and circuit component mounted in piezoelectric gyro, piezoelectric switch, piezoelectric transducer, piezoelectric breaker or the like, and any other devices that utilize piezoelectric characteristics.

The present invention is not limited to the embodiment described above, and various modifications may be made within the scope of the present invention.

EXAMPLES

The multi-layer piezoelectric element 1 of the present invention was fabricated as described below.

First, a stock material powder constituted from lead titanate zirconate (PZT) having mean particle size of 0.4 μm as the main component, a binder and a plasticizer were mixed to form a slurry which was formed into ceramic green sheets A having thickness of about 150 μm by the doctor blade process. Ceramic green sheets B having thickness of about 150 μm were also formed by mixing tetraethoxysilane (TEOS) in slurry so that 0.01 wt % of $SiO_2$ was contained in the PZT powder as the bonding material 21.

Then an electrically conductive paste A was prepared by adding a binder to a stock material powder that contained a silver alloy powder of composition Ag 95 wt %-Pd 5 wt %. An electrically conductive paste B was also prepared by adding a binder to a stock material powder that contained a silver alloy powder of composition Ag 98 wt %-Pd 2 wt %. In addition, an electrically conductive paste C was prepared by adding tetraethoxysilane (TEOS) and a binder to a stock material powder that contained a silver alloy powder of composition Ag 98 wt %-Pd 2 wt % so that 0.01 wt % of $SiO_2$ was contained in the silver alloy powder as the bonding material 21.

In specimen No. 1, the electrically conductive paste A was printed with a thickness of 30 μm by screen printing to one side of the sheet A. The sheets A having the electrically conductive paste A printed thereon were stacked to form the multi-layer structure 7. 300 metal layers 5 were stacked, and 20 ceramic green sheets A without electrically conductive paste printed thereon were stacked on both ends in the stacking direction of the multi-layer structure 7.

In specimen No. 2, the electrically conductive paste A was printed with a thickness of 30 μm by the screen printing process to one side of the sheet A. The electrically conductive paste B was printed with a thickness of 30 μm by screen printing to one side of the sheet B. The multi-layer structure 7 was made by stacking the sheets A having the electrically conductive paste A printed thereon and the sheets B having the electrically conductive paste B printed thereon, so that the electrically conductive paste B printed on the sheets B would be located at five positions of the $50^{th}$, $100^{th}$, $150^{th}$, $200^{th}$ and $250^{th}$ metal layers 5 in the stacking direction. Similarly to specimen No. 1, 300 metal layers 5 were stacked, and 20 ceramic green sheets A without electrically conductive paste printed thereon were stacked on both ends in the stacking direction of the multi-layer structure 7.

In specimen No. 3, the multi-layer structure 7 was made similarly to specimen No. 2. However, In contrast to specimen No. 2 where only one side of the electrically conductive paste B in the stacking direction adjoins the sheet B, the electrically conductive paste B is interposed between the sheets B in specimen No. 3.

In specimen No. 4, the electrically conductive paste A was printed with a thickness of 30 μm by the screen printing process to one side of the sheet A. The electrically conductive paste C was printed with a thickness of 30 μm by the screen printing process to one side of another sheet A. The multi-layer structure 7 was made by stacking the sheets A having the electrically conductive paste A printed thereon and the sheets A having the electrically conductive paste C printed thereon, so that the electrically conductive paste C would be located on the 50$^{th}$, 100$^{th}$, 150$^{th}$, 200$^{th}$ and 250$^{th}$ metal layers 5 in the stacking direction. Similarly to specimen No. 1, 300 metal layers 5 were stacked, and 20 ceramic green sheets A without electrically conductive paste printed thereon were stacked on both ends in the stacking direction of the multi-layer structure 7.

Void ratio is the proportion (%) of the area occupied by the voids 17 to the cross sectional area of the multi-layer structure 7 that is cut at right angles or parallel to the stacking direction of the multi-layer structure 7. Void ratio was measured as described below.

First, the multi-layer structure 7 was polished by known polishing means so as to reveal a section perpendicular to the stacking direction. Polishing operation may be done, for example, by using a desktop polishing machine KEMET-V-300 available from KEMET Japan Inc. and a diamond paste. Void ratio can be measured by observing the section exposed by this polishing operation, under an SEM, optical microscope, metallurgical microscope or the like and processing an image of the section taken in this observation.

TABLE 1

| | Internal electrode | | | Low-rigidity metal layer | | | |
|---|---|---|---|---|---|---|---|
| Specimen No. | Metal composition of paste printed | Metal composition after firing | Void ratio (%) | Metal composition of paste printed | Metal composition after firing | Void ratio (%) | Form |
| 1 | Ag 95% Pd 5% | Ag 95% Pd 5% | 25 | — | — | — | — |
| 2 | Ag 95% Pd 5% | Ag 96% Pd 4% | 15 | Ag 98% Pd 2% | Ag 96% Pd 4% | 80 | FIG. 7 |
| 3 | Ag 95% Pd 5% | Ag 96% Pd 4% | 15 | Ag 98% Pd 2% | Ag 96% Pd 4% | 80 | FIG. 8 |
| 4 | Ag 95% Pd 5% | Ag 96% Pd 4% | 10 | Ag 98% Pd 2% (SiO$_2$ is added) | Ag 96% Pd 4% | 80 | FIG. 6 |

After firing the multi-layer structure 7 of each specimen number at a predetermined temperature so as to remove the binder, the stack was fired at a temperature from 800 to 1,200° C. so as to obtain a sintered body. The electrically conductive paste A and the electrically conductive paste B having different silver contents were used in the multi-layer structure 7 of the specimens No. 2 and No. 3, and the electrically conductive paste A and the electrically conductive paste C having different silver contents were used in the multi-layer structure 7 of the specimen No. 4. As a result, silver diffused from the electrically conductive paste B or the electrically conductive paste C of higher silver concentration to the electrically conductive paste A of lower silver concentration. This caused the low-rigidity metal layer 15 having high void ratio of 80% to be formed as shown in Table 1.

Then the external electrodes 9 were formed after machining the sintered bodies to the desired dimensions. First, the electrically conductive paste to form the external electrode 9 was prepared by mixing a binder, a plasticizer, a glass powder and the like to a metal powder constituted mainly from silver. The external electrodes 9 were formed by printing the electrically conductive paste by screen printing or the like at positions on the side faces of the sintered body where the external electrodes 9 were to be formed and firing at a temperature from 600 to 800° C. Thus the multi-layer piezoelectric element 1 was made.

Two multi-layer piezoelectric elements 1 were made for each specimen number. This was for the purpose of evaluation, one to be observed under a scanning electron microscope (SEM) and one for operation test. Composition of the electrically conductive paste used to make the multi-layer piezoelectric element 1 for each specimen number, void ratio of the metal layer 5 after firing and shape of the low-rigidity metal layer 15 are shown in Table 1.

A shown in Table 1, the low-rigidity metal layer 15 was not formed in the multi-layer piezoelectric element 1 of specimen No. 1 since it employed the electrically conductive paste of the same composition. On the other hand, in the multi-layer piezoelectric elements 1 of specimens No. 2 to No. 4, the low-rigidity metal layer 15 was formed due to the diffusion of silver. Also it can be seen that void ratio of the low-rigidity metal layer 15 was 80% in contrast to the void ratio of 15% in the metal layer 5, and that the low-rigidity metal layer 15 of lower rigidity than those of the metal layer 5 and the piezoelectric material, layer 3 could be formed.

A shown in Table 1, observation with SEM showed that in specimen No. 2, all metal parts 19 of one low-rigidity metal layer 15 were bonded with only one (the lower piezoelectric material layer 3 in the case shown in FIG. 7) of the two piezoelectric material layers 3 that adjoin in the stacking direction as shown in FIG. 7. This is because the bonding material 21 was mixed only in one of the two piezoelectric material layers 3 that adjoin the low-rigidity metal layer 15 in the stacking direction.

In specimen No. 3, a plurality of metal parts 19 of the low-rigidity metal layers 15 were bonded with only one of the two piezoelectric material layers 3 that adjoin in the stacking direction as shown in FIG. 8. This is because glass layer consisting of an oxide of Si—Pb—Ag was mixed as the bonding material 21 in both of the two piezoelectric material layers 3 that adjoin the low-rigidity metal layer 15 in the stacking direction. The bonding material 21 was evaluated by the EPMA and XRD analyses.

In specimen No. 4, part of the plurality of metal layers 19 of the low-rigidity metal layer 15 were bonded via the bonding material 21 with both of the two piezoelectric material layers 3 that adjoin in the stacking direction as shown in FIG. 6. This is because the bonding material 21 mixed in the electrically conductive paste diffused along with silver.

Then operation was evaluated. Evaluation of operation was made on high-speed response and durability.

First, lead wires were connected to the external electrodes 9, and DC electric field of 3 kV/mm was applied between the external electrodes 9 of positive and negative polarities via the lead wires so as to apply polarization treatment for 15 minutes, thereby to make the piezoelectric actuator based on the multi-layer piezoelectric element 1. When a DC voltage of 170 V was applied to the multi-layer piezoelectric element thus obtained to measure the amount of displacement in the initial condition, the piezoelectric actuator of specimen No. 1 underwent displacement of 45 μm and the piezoelectric actuators of specimens No. 2 to No. 4 underwent displacement of 40 μm. The piezoelectric actuator of specimen No. 1 underwent greater displacement than the piezoelectric actuators of the other specimens because the low-rigidity metal layers 15 did not serve as the internal electrodes 13 in the multi-layer piezoelectric elements 1 of specimens No. 2 to No. 4.

High-speed response was evaluated by applying AC voltage in a range from 0 to +170 V to each piezoelectric actuator with frequency being increased from 150 Hz gradually upward at the room temperature. Durability was evaluated by applying AC voltage to each piezoelectric actuator in a range from 0 to +170 V at a frequency of 150 Hz at the room temperature, to carry out continuous operation test of $1 \times 10^9$ cycles. Results of the test are shown in Table 2.

TABLE 2

| Specimen No. | Amount of displacement at initial state (μm) | Harmonics noise | Beat at 1 kHz or higher | Amount of displacement after $1 \times 10^9$ cycles (μm) | Peel off between layers after continuous operation ($1 \times 10^9$ cycles) |
| --- | --- | --- | --- | --- | --- |
| 1 | 45 | Present | Present | 5 | Present |
| 2 | 40 | None | None | 35 | None |
| 3 | 40 | None | None | 38 | None |
| 4 | 40 | None | None | 40 | None |

As shown in Table 2, the piezoelectric actuator of specimen No. 1 generated beating sound when the frequency exceeded 1 kHz during high-speed response evaluation test. This is because the multi-layer piezoelectric element 1 of the specimen No. 1 was not provided with the low-rigidity metal layer 15, and therefore the internal electrodes 13 exerted greater restrictive force on the piezoelectric material layer 3. It is supposed that the greater restrictive force on the piezoelectric material layer 3 compromised the high-speed response, and the piezoelectric material layer could not act at the frequency of the alternate voltage applied.

Pulse waveform of the piezoelectric actuator of specimen No. 1 was observed on an oscilloscope. DL1640L manufactured by Yokogawa Electric Corporation to check the drive frequency. Harmonics noise was observed at frequencies of integral multiples of the drive frequency.

The piezoelectric actuator of specimen No. 1 underwent displacement of 5 μm after durability test, nearly 90% less than the level it showed before the test, as shown in Table 2. A part of the multi-layer piezoelectric element peeled off in the piezoelectric actuator of specimen No. 1.

The piezoelectric actuators of specimens No. 2 to No. 4, in contrast, showed no peel-off, and underwent displacement of 35 to 40 μm after the durability test, the amount decreasing by less than 10% from the level achieved before the test. The piezoelectric actuator of specimen No. 4, in particular, showed no substantial decrease in the amount of displacement, proving that it had very high durability.

The invention claimed is:

1. A multi-layer piezoelectric element comprising a multi-layer structure in which a plurality of piezoelectric material layers and a plurality of metal layers are stacked alternately one on another,
wherein the piezoelectric material layer comprises a plurality of piezoelectric crystal grains, the plurality of metal layers comprise internal electrodes and low-rigidity metal layer that has rigidity lower than those of the internal electrodes and the piezoelectric material layer, and
wherein the low-rigidity metal layer comprises a plurality of metal parts that are separated from each other, and a portion of the metal part infiltrates between the piezoelectric crystal grains of one piezoelectric material layer that adjoins the low-rigidity metal layer in the stacking direction.

2. The multi-layer piezoelectric element according to claim 1, wherein voids exist between the metal parts.

3. The multi-layer piezoelectric element according to claim 1, wherein the portion of the metal part infiltrating between the piezoelectric crystal grains has wedge shape.

4. The multi-layer piezoelectric element according to claim 1, wherein the piezoelectric material layer further comprises a bonding material that is disposed between the plurality of piezoelectric crystal grains and bonds the adjacent piezoelectric crystal grains, and
wherein the metal parts are bonded with the piezoelectric crystal grains by the bonding material.

5. A multi-layer piezoelectric element comprising a multi-layer structure in which a plurality of piezoelectric material layers and a plurality of metal layers are stacked alternately one on another,
wherein the piezoelectric material layer comprising a plurality of piezoelectric crystal grains and a bonding material that is disposed between the piezoelectric crystal grains and bonds the adjacent piezoelectric crystal grains, and
wherein the plurality of metal layers comprise internal electrode and low-rigidity metal layer that has rigidity lower than those of the internal electrode and the piezoelectric material layer, the low-rigidity metal layer comprises a plurality of metal parts that are separated from each other, and a portion of the metal part is bonded with the piezoelectric crystal grains of one piezoelectric material layer that adjoins the low-rigidity metal layer in the stacking direction by the bonding material.

6. The multi-layer piezoelectric element according to claim 5, wherein the portion of the metal part infiltrates between the piezoelectric crystal grains.

7. The multi-layer piezoelectric element as in claim 5, wherein the bonding material contains glass as a main component.

8. The multi-layer piezoelectric element as in claim 5, wherein the bonding material contains a main component of the metal part.

9. The multi-layer piezoelectric element according to claim 5, wherein the bonding material contains an oxide of the main component of the metal part.

10. The multi-layer piezoelectric element as in claim 5, wherein the metal part is bonded with only one piezoelectric material layer among the two piezoelectric material layers that adjoin in the stacking direction.

11. The multi-layer piezoelectric element according to claim 10, wherein the metal part is separated from the other piezoelectric material layer among the two piezoelectric material layers that adjoin in the stacking direction.

12. The multi-layer piezoelectric element as in claim 10, wherein the metal part is bonded with two or more piezoelectric crystal grains of said one piezoelectric material layer.

13. The ejection apparatus comprising:
   a container comprising an ejection hole; and
   the multi-layer piezoelectric element according to one of claims 1 to 3, 4, 5 to 7, 8 to 12 housed in the container,
   wherein the ejection apparatus configured to eject a liquid filled in the container through the ejection hole by an operation of the multi-layer piezoelectric element.

14. A fuel ejection system comprising:
   a common rail that stores a high-pressure fuel;
   an ejection apparatus according to claim 13 that ejects the fuel stored in the common rail;
   a pressure pump that supplies the high pressure fuel to the common rail; and
   an ejection control unit that supplies a drive signal to the ejection apparatus.

* * * * *